United States Patent
Tabery et al.

(10) Patent No.: US 6,551,888 B1
(45) Date of Patent: Apr. 22, 2003

(54) TUNING ABSORPTION LEVELS DURING LASER THERMAL ANNEALING

(75) Inventors: Cyrus E. Tabery, Cupertino, CA (US); Eric N. Paton, Morgan Hill, CA (US); Bin Yu, Cupertino, CA (US); Qi Xiang, San Jose, CA (US); Robert B. Ogle, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/020,496

(22) Filed: Dec. 18, 2001

(51) Int. Cl.[7] ............................................. H01L 21/336
(52) U.S. Cl. ...................................... 438/308; 438/535
(58) Field of Search ................................ 438/292, 308, 438/530, 535, 795

(56) References Cited

U.S. PATENT DOCUMENTS

| | | | | |
|---|---|---|---|---|
| 4,431,459 A | * | 2/1984 | Teng | 438/308 |
| 4,500,365 A | * | 2/1985 | Mori | 438/530 |
| 4,646,426 A | * | 3/1987 | Sasaki | 438/535 |
| 5,401,666 A | * | 3/1995 | Tsukamoto | 438/308 |
| 6,326,219 B2 | * | 12/2001 | Markle et al. | 438/308 |
| 6,380,044 B1 | * | 4/2002 | Talwar et al. | 438/308 |

* cited by examiner

Primary Examiner—Chandra Chaudhari

(57) ABSTRACT

A method of manufacturing a semiconductor device includes forming a gate electrode over a substrate, introducing dopants into the substrate, forming a tuning layer over at least a portion of the substrate, and activating the dopants using laser thermal annealing. The tuning layer causes an increase or a decrease in the amount of fluence absorbed by the portion of substrate below the tuning layer in comparison to an amount of fluence absorbed by a portion of substrate not covered by the tuning layer. Additional tuning layers can also be formed over the substrate.

20 Claims, 10 Drawing Sheets

TUNING ABSORPTION LEVELS DURING LASER THERMAL ANNEALING

FIELD OF THE INVENTION

The present invention relates to the manufacturing of semiconductor devices, and more particularly, to laser anneal processes having improved efficiency.

BACKGROUND OF THE INVENTION

Over the last few decades, the semiconductor industry has undergone a revolution by the use of semiconductor technology to fabricate small, highly integrated electronic devices, and the most common semiconductor technology presently used is silicon-based. A large variety of semiconductor devices have been manufactured having various applications in numerous disciplines. One silicon-based semiconductor device is a metal-oxide-semiconductor (MOS) transistor. The MOS transistor is one of the basic building blocks of most modern electronic circuits. Importantly, these electronic circuits realize improved performance and lower costs, as the performance of the MOS transistor is increased and as manufacturing costs are reduced.

A typical MOS semiconductor device includes a semiconductor substrate on which a gate electrode is disposed. The gate electrode, which acts as a conductor, receives an input signal to control operation of the device. Source and drain regions are typically formed in regions of the substrate adjacent the gate electrodes by doping the regions with a dopant of a desired conductivity. The conductivity of the doped region depends on the type of impurity used to dope the region. The typical MOS transistor is symmetrical, in that the source and drain are interchangeable. Whether a region acts as a source or drain typically depends on the respective applied voltages and the type of device being made. The collective term source/drain region is used herein to generally describe an active region used for the formation of either a source or drain.

The semiconductor industry is continually striving to improve the performance of MOSFET devices. The ability to create devices with sub-micron features has allowed significant performance increases, for example, from decreasing performance degrading resistances and parasitic capacitances. The attainment of sub-micron features has been accomplished via advances in several semiconductor fabrication disciplines. For example, the development of more sophisticated exposure cameras in photolithography, as well as the use of more sensitive photoresist materials, have allowed sub-micron features, in photoresist layers, to be routinely achieved. Additionally, the development of more advanced dry etching tools and processes have allowed the sub-micron images in photoresist layers to be successfully transferred to underlying materials used in MOSFET structures.

As the distance between the source region and the drain region of the MOSFET (i.e., the physical channel length) decreases, in the effort to increase circuit speed and complexity, the junction depth of source/drain regions must also be reduced to prevent unwanted source/drain-to-substrate junction capacitance. However, obtaining these smaller junction depths tests the capabilities of current processing techniques, such as ion implantation with activation annealing using rapid thermal annealing. Rapid thermal annealing typically involves heating the silicon wafer, after implanting, under high-intensity heat lamps. Implanting or doping amorphizes the silicon substrate, and the activation annealing is used to recrystallize the amorphized silicon region.

As a result of the limitations of rapid thermal annealing, laser thermal annealing is being implemented, particularly for ultra-shallow junction depths. Laser thermal annealing may be performed after ion implantation of a dopant and involves heating the doped area with a laser. The laser radiation rapidly heats the exposed silicon such that the silicon begins to melt. The diffusivity of dopants into molten silicon is about eight orders of magnitude higher than in solid silicon. Thus, the dopants distribute almost uniformly in the molten silicon and the diffusion stops almost exactly at the liquid/solid interface. The heating of the silicon is followed by a rapid quench to solidify the silicon, and this process allows for non-equilibrium dopant activation in which the concentration of dopants within the silicon is above the solid solubility limit of silicon. Advantageously, this process allows for ultra-shallow source/drain regions that have an electrical resistance about one-tenth the resistance obtainable by conventional rapid thermal annealing.

A problem associated with laser thermal annealing is that the fluence absorbed by the substrate can vary across the wafer, as illustrated in FIG. 1. For example, as the density of gate electrodes 4 in a particular area of a wafer 2 increases, the amount of fluence 6 reflected or scattered from that particular area also increases, as compared to an area with a lesser density of gate electrodes 4. When the fluence 6 reflected by a particular area increases, the amount of fluence 7 absorbed by that area decreases. The opposite holds true as the density of gate electrodes 4 in a particular area decreases. Therefore, depending upon certain factors, such as the density of gate electrodes, the amount of fluence 7 absorbed at given areas varies throughout the wafer 2.

As an illustrative example, a first region 8 and a second region 9 are positioned on a semiconductor wafer 2, and both the first and second regions 8, 9 are assumed to have identical requirements for fluence 7 absorbed during laser thermal annealing. The density of gate electrodes 4 in the first region 8 is also assumed to be higher than the density of gate electrodes 4 in the second region 9, and the first region 8 reflects approximately 10% of the laser energy 6 during laser thermal annealing, and the second region 9 reflects approximately 1% of the laser energy 6 during laser thermal annealing. Thus, the second region 9 absorbs about 10% more fluence 7 than the first region 8. As both the first and second regions 8, 9 have the same fluence requirements, either the first region 8 receives too little fluence 7 or the second region 9 receives too much fluence 7 or both. Accordingly, a need exists for an improved laser anneal process that allows a greater control of fluence being provided to the substrate at different areas on the substrate.

SUMMARY OF THE INVENTION

This and other needs are met by embodiments of the present invention which provide a method of manufacturing a semiconductor device that allows for control of the fluence absorbed by different portions on a semiconductor wafer. The method includes forming a gate electrode over a substrate, introducing dopants into the substrate, forming a tuning layer over at least a portion of the substrate, and activating the dopants using laser thermal annealing. The tuning layer causes an increase or a decrease in the amount of fluence absorbed by the portion of substrate below the tuning layer in comparison to an amount of fluence absorbed by the portion, if the portion was not covered by the tuning layer. Additional tuning layers can also be formed over the substrate.

By providing one or more tuning layers, the fluence received in particular portions on the wafer during laser thermal annealing can be controlled. Thus, when an area on the substrate receives too much or too little fluence, the fluence received by that particular portion can be adjusted to a more optimal amount using the tuning layer. Furthermore, if the wafer includes portions which require differing amounts of fluence absorption, the tuning layer can be used to modify the fluence absorption of these portions without requiring the modification of the fluence provided by the laser.

In another aspect of the invention, the ions are introduced into the substrate before the formation of the tuning layer, or alternatively, the ions are introduced into the substrate after initiation of the tuning layer formation step. Also, the tuning layer can be formed from such materials as a resist, an organic anti-reflective material, or a dielectric.

One method of forming the tuning layer includes forming a first layer of tuning material over the substrate, and removing portions of the first layer to form the tuning layer. This method can also include forming a second layer of the tuning material over the substrate and the first layer. Another method of forming the tuning layer includes forming a first layer of a first tuning material over the substrate, removing portions of the first layer, and forming a second layer of a second tuning material over the first layer and the substrate to form the tuning layer. This method can also include planarizing the first and second layers such that the first and second layers have approximately equal depths. Still another method of forming the tuning layer includes forming a first layer of adjustable tuning material over the substrate, and selectively irradiating portions of the first layer to adjust the properties of the tuning material or selectively doping portions of the first layer to adjust the properties of the tuning material.

In another embodiment of the invention, the method includes forming semiconductor features over a substrate, forming a tuning layer over at least a portion of the substrate, and laser thermal annealing. The tuning layer adjusts the amount of fluence absorbed during the step of laser thermal annealing by causing an increase or a decrease in the amount of fluence absorbed by the portion of substrate below the tuning layer in comparison to an amount of fluence absorbed by the portion, if the portion was not covered by the tuning layer. The substrate has a first region and a second region with the density of the semiconductor features in the first region different than the density of the semiconductor features in the second region.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the present invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout, and wherein.

DETAILED DESCRIPTION OF THE INVENTION

The present invention provides a process of adjusting the amount of fluence absorbed by particular areas on the surface of a semiconductor substrate during laser thermal annealing. This is achieved, in part, by providing one or more tuning layers that can increase or decrease the amount of fluence absorbed by an area below the tuning layer. In so doing, areas in the substrate that require more or less fluence than would have been provided by previous processes can have the amount of fluence received increased or decreased as required.

An embodiment of the present invention is illustrated in FIGS. 2A–2H. A substrate is provided and can be formed from any material suitable for integrated circuit manufacture. However, in one aspect, the substrate is formed from single-crystal silicon, with a <100> crystallographic orientation and which has been slightly doped with n-type or p-type impurities. Separate MOS devices are separated on the silicon substrate using isolation structures, such as a field oxide or a shallow isolation trench (not shown).

A shallow isolation trench, for example, can be formed by etching either isotropically with wet techniques or anisotropically with dry etch techniques. An oxide is thereafter deposited within the trench. As an alternative to the shallow isolation trench, a field oxide can be formed. A field oxide is typically formed via thermal oxidation in an oxygen-steam ambient at temperatures from about 850 to 1050° C. A patterned, oxidation-resistant mask can be used to prevent oxidation of non-isolation device regions. After formation of the field oxide, the mask is removed using known techniques, for example hot phosphoric acid for a silicon nitride mask or buffered hydrofluoric acid for a pad oxide mask.

Figure 2A:
FIGS. 2A–2H schematically illustrate sequential phases of a semiconductor fabrication method using a laser thermal annealing process according to an embodiment of the present invention.
Figure 2A:
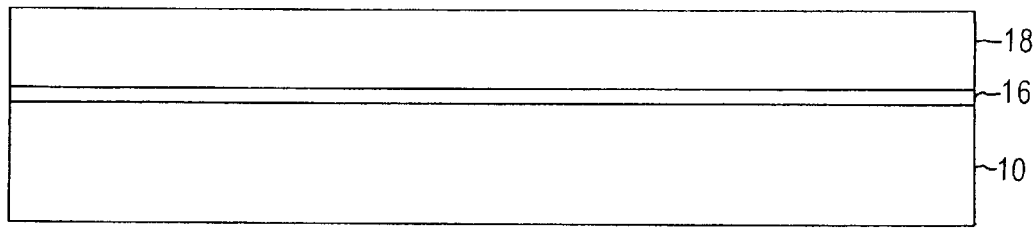

In FIG. 2A, a gate dielectric 16 is formed on the top surface of the substrate 10, and the gate dielectric 16 is not limited as to a particular material. However, in one aspect of the invention, the gate dielectric 16 is formed from silicon dioxide, for example, using thermal oxidation at temperatures from about 700 to 1000° C. in an oxygen-steam ambient. Although not limited in this manner, the gate dielectric 16 can have a thickness from about 30 to 200 angstroms. After deposition of the gate dielectric 16, a gate electrode is formed over the gate dielectric 16.

Although the gate electrode is not limited as to a particular material, in a current aspect of the invention, the formation of a gate electrode involves depositing a blanket layer of undoped polysilicon 18, for example by low pressure chemical vapor deposition (LPCVD) at temperatures from about 600 to 800° C., on the top surface of gate dielectric 16. Although not limited in this manner, the polysilicon layer 18 can have a thickness from about 500 to 5000 angstroms. The polysilicon layer 18 can then be implanted with nitrogen ions, as depicted by arrows 20, which can be used, for example, to retard the diffusion of boron atoms. The implantation of the nitrogen ions can be at a dosage from about $5 \times 10^{14}$ to $5 \times 10^{15}$ dopants/cm$^2$ and at an energy level from about 20 to 200 keV.

Figure 2B:
Figure 2B:
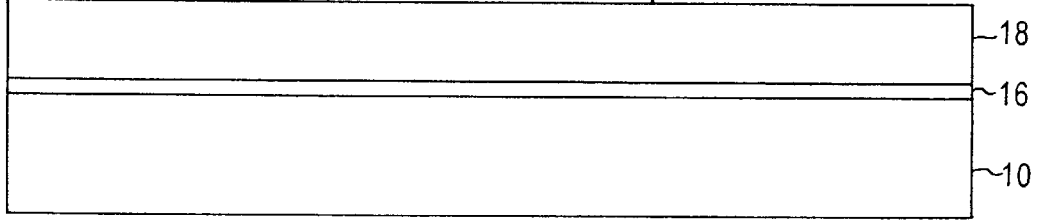

In FIG. 2B, the layers over the gate dielectric 16 are etched to form the gate electrode. The etching of the gate typically involves forming a resist 22 on the polysilicon layer 18, and the resist 22 is selectively irradiated using a lithographic system, such as a step and repeat optical projection system, in which ultraviolet light from a mercury-vapor lamp is projected through a first reticle and a focusing lens to obtain a first image pattern. The resist 22 is then developed, and the irradiated portions of the resist 22 are removed to provide openings in the resist 22. The openings expose portions of the polysilicon layer 18, which will thereby define the gate electrode.

Figure 2C:
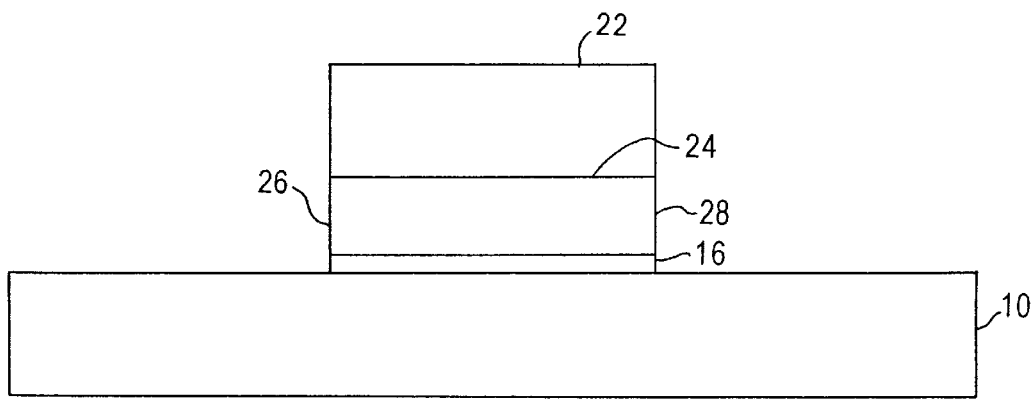

In FIG. 2C, an etch, typically anisotropic, is applied to remove the exposed portions of the polysilicon layer 18 and the underlying portions of the gate dielectric 16. After etching, the remaining portion of the polysilicon layer 18 provides a gate electrode 24 having opposing vertical sidewalls 26, 28. Although not limited in this manner, the width of the gate electrode 24 between the sidewalls 26, 28 can be from about 500 to 2500 angstroms.

Figure 2D:
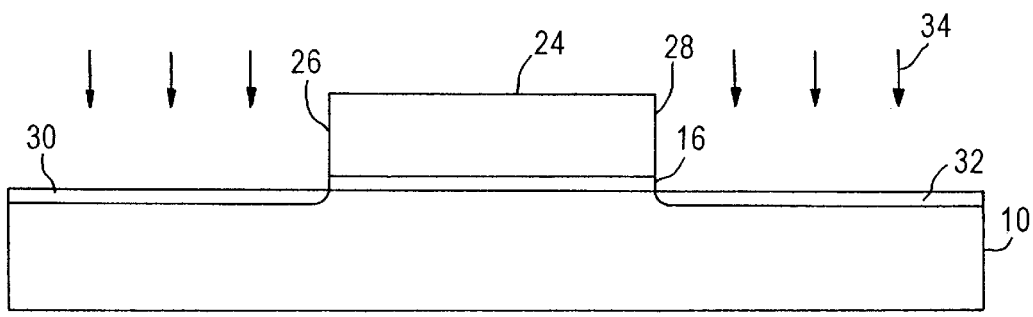

In FIG. 2D, the resist 22 is stripped, and lightly doped (LDD) source/drain extensions 30, 32 are formed by an ion implantation, as represented by arrows 34. The ion implantation may be an n-type dopant, such as arsenic or phosphorus, if an NMOSFET is desired, or a p-type dopant, such as boron, if a PMOSFET is desired. Illustrative examples of implant energies and dosages for doping respectively range from about 2 to 20 keV and from about $5 \times 10^{14}$ to $3 \times 10^{15}$ dopants/cm$^2$. The source/drain extensions 30, 32 are formed within the substrate 10 immediately adjacent to the sidewalls 26, 28 and are self-aligned with the gate electrode 24. After implantation, annealing is conducted to activate the source/drain extensions 30, 32 and to recrystallize the extensions. Alternatively, the annealing can occur after formation of the source/drain regions. The annealing of the source/drain extensions 30, 32 is not limited as to a particular method. For example, rapid thermal anneal or laser thermal annealing can be used. Typically, the source/drain extensions 30, 32 extend down from the surface of the silicon substrate 10 to a depth of about 50 angstroms to 300 angstroms.

Figure 2E:
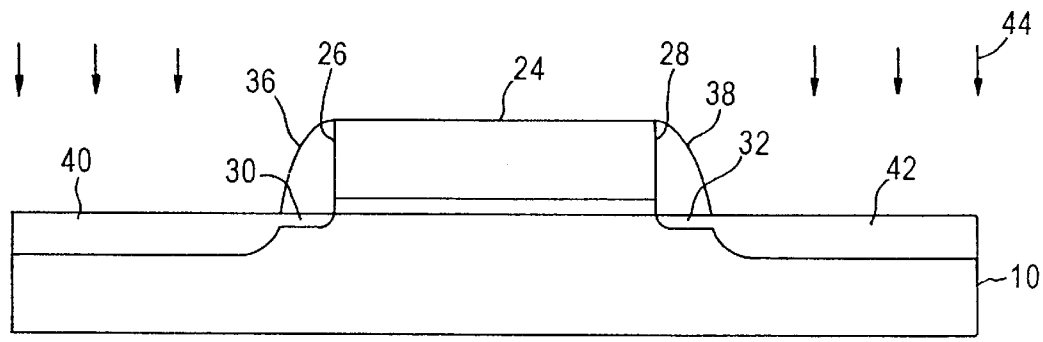

In FIG. 2E, sidewall spacers 36, 38 are formed following the implantation of the source/drain extensions 30, 32. Formation of the sidewall spacers 36, 38 typically involves blanket depositing a spacer material over the substrate 10. The spacer material can be silicon nitride or some other material, such as plasma-enhanced oxide (PEOX) or tetra-ethoxysilane (TEOS) oxide. The blanket deposition is followed by an anisotropic etch, which removes the spacer material except for the sidewall spacers 36, 38 immediately adjacent to the sidewalls 26, 28 of the gate electrode 24 and over the substrate 10.

After formation of the sidewall spacers 36, 38, heavily doped (HDD) or moderately doped (MDD) source/drain regions 40, 42 are formed by a second ion implantation, as represented by arrows 44. The source/drain regions 40, 42 are formed within the substrate 10 and extend past the source/drain extensions 30, 32 immediately adjacent to the sidewall spacers 36, 38. The sidewall spacers 36, 38 act as masks, which protect portions of the source/drain extensions 30, 32 from being heavily doped. Illustrative examples of implant energies and dosages for doping respectively range from about 0.5 keV to 60 keV and from about $1 \times 10^{14}$ to $5 \times 10^{15}$ dopants/cm$^2$.

In one aspect of the invention, the source/drain regions 40, 42 can also be amorphized, and an example method of amorphizing the substrate 10 involves doping the substrate with an inert atom, such as Si, Ge, or a noble ion. Illustrative examples of implant energies and dosages for doping respectively range from about 30 keV to 130 keV and from about $5 \times 10^{13}$ to $5 \times 10^{14}$ dopants/cm$^2$. The implanting of the source/drain regions 40, 42 with an inert atoms amorphizes the silicon, which must then be recrystallized to activate the source/drain regions 40, 42.

Figure 2F:
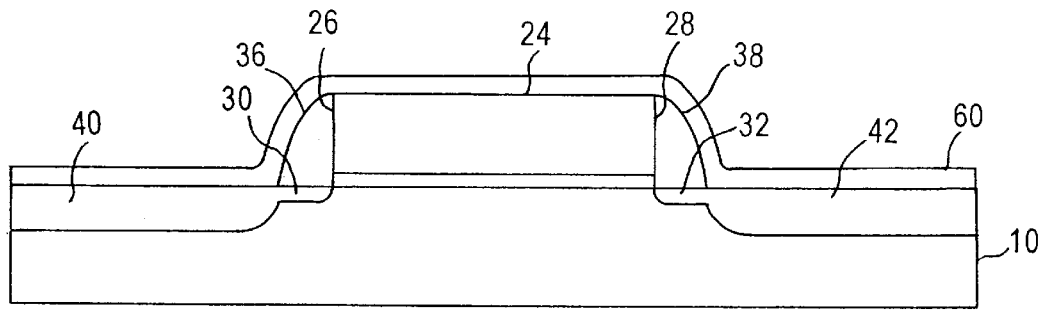

In FIG. 2F, after implantation of the source/drain regions 40, 42, a tuning layer 60 can be formed over the source/drain regions 40, 42 and the gate electrode 24 before the source/drain regions 40, 42 are activated using a laser thermal annealing process. The tuning layer 60 modifies or adjusts the amount of fluence absorbed by the source/drain regions 40, 42 and the gate electrode 24 during the laser thermal annealing process as compared to the amount of fluence the source/drain regions 40, 42 and the gate electrode 24 would absorb without the tuning layer 60.

Figure 1:
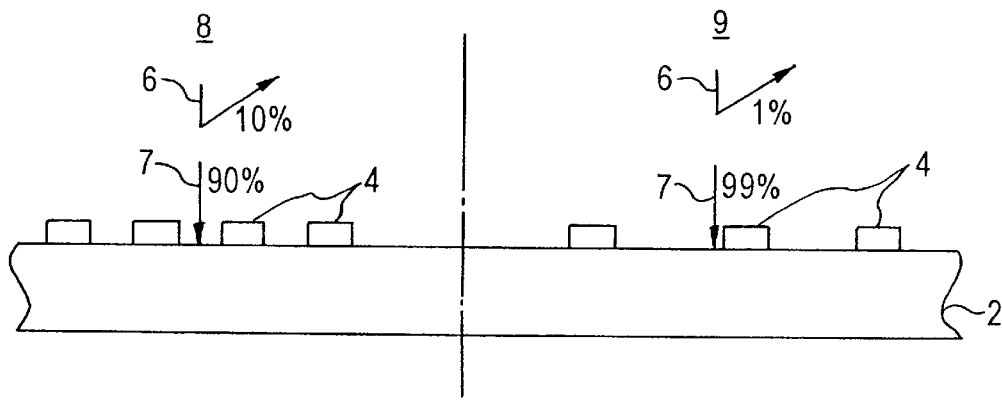
FIG. 1 schematically illustrates relative absorption between low and high-density feature regions of a conventional laser thermal annealing process.
Figure 3:
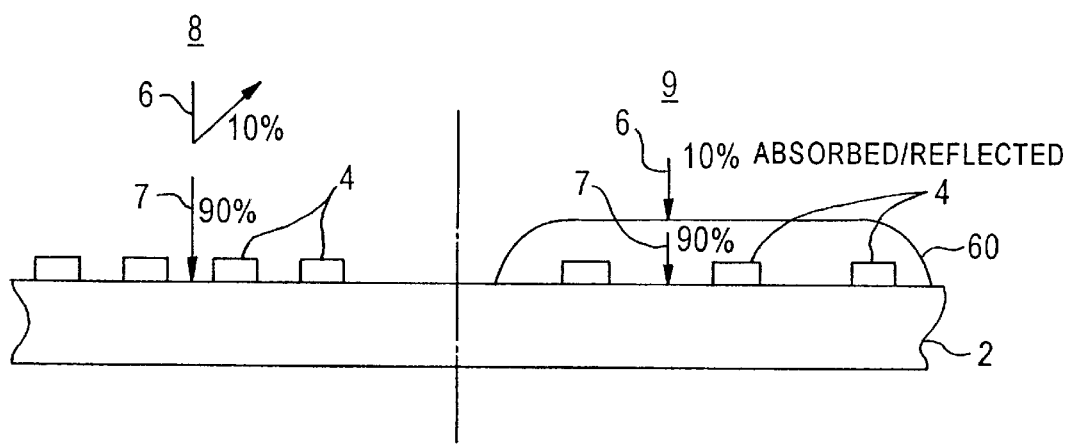
FIG. 3 schematically illustrates relative absorption between low and high-density feature regions of a laser thermal annealing process using a tuning layer according to an embodiment of the present invention.

Referring back to the previously described example shown in FIG. 1 in which a first region 8 and a second region 9 are positioned on a semiconductor wafer 2, and both the first and second regions 8, 9 have identical fluence requirements during laser thermal annealing, as illustrated in FIG. 3, a tuning layer 60 can be used to adjust the fluence 7 absorbed by each region 8, 9. In the previous example, the first region 8 reflects approximately 10% of the laser energy 6 during laser thermal annealing, and the second region 9 reflects approximately 1% of the laser energy 6 during laser thermal annealing. However, the tuning layer 60 positioned over the second region 9 can reduce the amount of fluence 7 received by the second region by 10%, and the amounts of fluence 7 received by the first region 8 and the second region 9 can therefore be advantageously approximately equal.

In certain instances, the amount of fluence absorbed would increase, and in other instances, the amount of fluence absorbed would decrease, as a result of the tuning layer 60. For example, the tuning layer 60 may be formed from an organic anti-reflective material, also known as BARC (bottom anti-reflective coating), that absorbs a portion of the fluence from the laser and reduces the amount of fluence absorbed by the source/drain regions and the gate electrode 4.

Referring again to FIG. 2F, instead of reducing the amount of fluence absorbed, the tuning layer 60 can also increase the amount of fluence absorbed. For example, if the tuning layer 60 is formed from silicon nitride, a coupling effect occurs between the silicon nitride and the silicon of the source/drain regions 40, 42 and the gate electrode 24. This coupling effect can act to reduce the reflectivity of the silicon, which thereby increases the amount of fluence absorbed. One particular advantage of using tuning layers that take advantage of the coupling effect to increase the amount of fluence absorbed is that less laser energy is reflected back into the tool being used during this process. The reflected laser energy is typically absorbed within the tool by the tool itself or other objects, such as the wafer, and the absorption of this laser energy can result in problems with the process and/or the tool. However, by reducing the amount of laser energy reflected by the wafer, these problems can be reduced.

Through the use of a tuning layer 60, the amount of fluence absorbed in a particular area of the wafer can be precisely tuned to more accurately provide the amount of fluence desired for that particular area. As will be discussed in more detail below, the wafer can be simultaneously tuned with one tuning layer 60 or multiple different tuning layers 60. In this manner, the fluence absorbed by different areas on the same wafer can either be increased, decreased, or remain the same, depending upon the fluence absorption requirements of the particular area. For example, if the amount of fluence to be absorbed is to be equal throughout the wafer, a tuning layer 60 that absorbs fluence can be positioned on portions of the wafer that receive excess fluence to reduce the amount of fluence absorbed by those particular portions. Alternatively, a similar result can be achieved by positioning a tuning layer 60 that increases the amount of fluence absorbed through the coupling affect on portions of the wafer that receive insufficient fluence.

A tuning layer 60 can also be used in applications in which two or more fluence absorption levels are required in a single wafer. As such, instead of adjusting the output of the laser during processing to provide for the two or more fluence deposition levels, one or more tuning layers 60 can be provided to adjust the fluence absorbed by particular areas of the wafer.

Figure 2G:
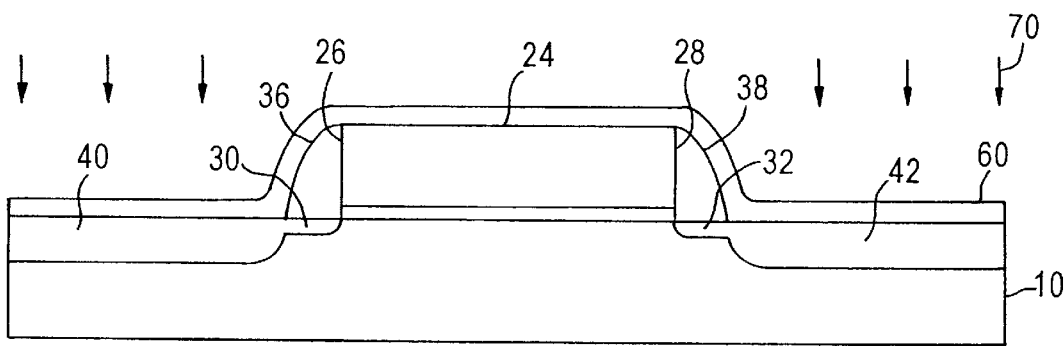

In FIG. 2G, after formation of the tuning layer 60, the source/drain regions 40, 42 are activated using a laser thermal annealing process. The energy from the laser, represented by arrows 70, is applied to liquefy the substrate 10 to the desired depth of source/drain regions 40, 42. As stated above, the fluence absorbed depends upon whether or not the laser energy 70 passes through a tuning layer 60 and the particular characteristics, such as absorption or coupling, of the tuning layer 60.

An example of a laser capable of providing the laser energy 70 is a spatially homogenized 308 nm XeCl pulsed laser, although the invention is not limited in this manner, and the energy and power of the laser can vary in accordance with different applications. Typically, the source/drain regions 40, 42 extend down from the surface of the silicon substrate 10 to a depth of about 400 angstroms to about 1000 angstroms.

The energy fluence of the laser at the surface determines the melt duration that occurs at the surface, and melt duration is related to maximum melt depth. The relationship between melt duration and maximum melt depth depends on the temporal profile of the laser beam. Precise control of junction or melt depth is possible due to the capability of measuring the full width height maximum (FWHM) of the laser and the surface melt duration during the process. Relatively large changes in the energy fluence are required to create small changes in the maximum melt depth. For example, a fluence range of approximately 100 mJ/cm$^2$ to 750 J/cm$^2$ results in junction depths ranging from 200 angstroms to 1500 angstroms from a 308 nm excimer laser at a 9 Hz repetition rate.

The fluence range for laser irradiation can extend from about 50 mJ/cm$^2$ to about 1.3 J/cm$^2$. However, the fluence of the laser can be advantageously controlled to melt only to a depth that the silicon has been amorphitized because amorphous silicon absorbs energy at a higher rate than crystalline silicon. For example, a fluence of about 400 mJ/cm$^2$ can be used to melt amorphous silicon and not melt crystalline silicon.

After the silicon in source/drain regions 40, 42 has been melted, which takes approximately 30–100 nanoseconds, the silicon will cool rapidly, within about one microsecond, and the silicon will reform epitaxially. In so doing, the source/drain regions are activated.

Figure 2H:
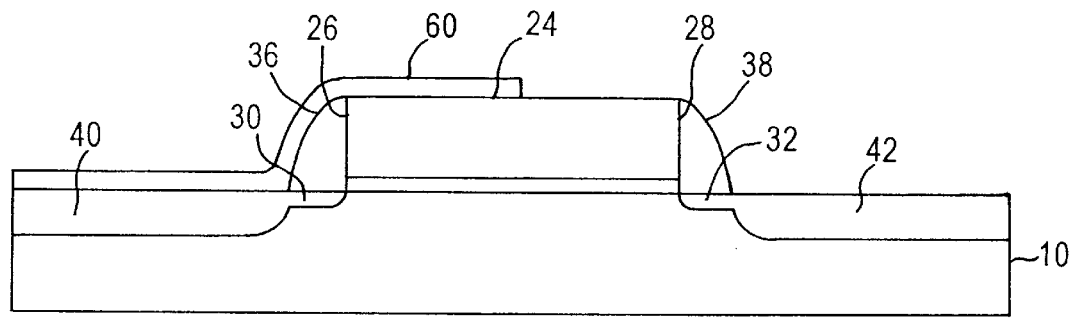

In FIG. 2H, after the laser thermal annealing process, the tuning layer 60 can be removed, and the invention is not limited as to a particular process for removing the tuning layer 60. However, in one aspect of the invention, the tuning layer 60 is removed without removing other portions of the semiconductor device. For example, if the tuning layer 60 is formed from an organic anti-reflective material, the tuning layer 60 can be removed with a wet-etch solution comprising $H_2SO_4/H_2O_2$. If, for example, the tuning layer 60 is formed from silicon nitride, the tuning layer 60 can be removed using an etchant of $CHF_3/N_2$. Also, a tuning layer 60 formed from a resist material can be removed by ashing, in which resist is oxidized with an $O_2$ plasma at elevated temperatures.

Alternatively, as also shown in FIG. 2H, removal of the tuning layer 60 is not required. In certain instances, for example when the tuning layer 60 is formed from an isolating material, such as silicon nitride, the tuning layer 60 can remain as part of the semiconductor device. A subsequent step in the formation of the semiconductor device is the formation of an interlevel dielectric layer or a passivation layer over the substrate 10. These layers are used to isolate the structures formed in the substrate 10. Typically, these layers are formed from isolating or insulating material, such as silicon oxide or silicon nitride, which prevent electrical shorting between the structures. However, if the tuning layer 60 also functions as an interlevel dielectric layer or passivation layer, the tuning layer 60 can remain as part of the semiconductor device and thereby advantageously eliminate the step of removing the tuning layer 60.

Figure 4A:
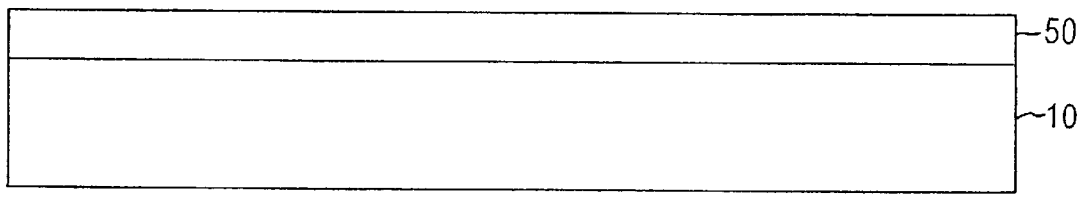
FIGS. 4A–4D schematically illustrate sequential phases of forming a tuning layer according to one aspect of the present invention.

Many types of methods are capable of providing tuning layers that can be tuned depending upon the required absorption of fluence, and the invention is not limited as to a particular type of method. One such method is illustrated in FIGS. 4A–4D. As shown in FIG. 4A, after formation of source/drain regions in the substrate 10, a first layer 50 of tuning material is blanket deposited over the substrate 10 and semiconductor devices, such as a gate electrode, on the substrate 10. The invention is not limited as to a particular type of tuning material that is used for the first layer 50, so long as the tuning material either increases or decreases the amount of fluence being absorbed. Examples of tuning materials include organic anti-reflective material, resists, and dielectrics such as silicon nitride, silicon oxide, and silicon oxynitride.

Figure 4B:
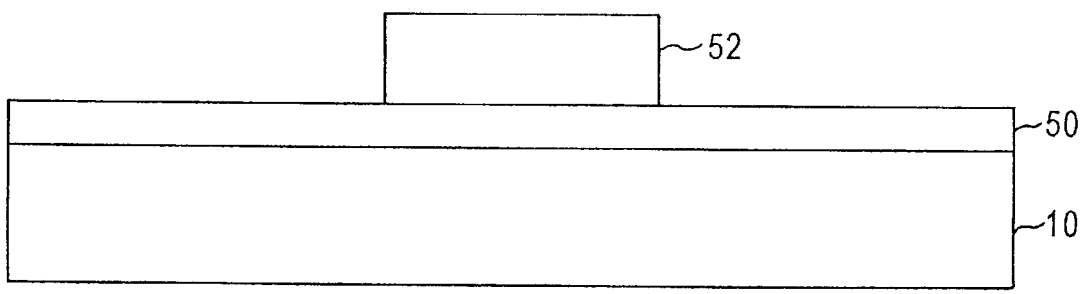

In FIG. 4B, the first layer 50 is etched to form a portion of the tuning layer. The etching of the first layer 50 typically involves forming a resist 52 on the first layer 50, and the resist 52 is selectively irradiated using a lithographic system, such as a step and repeat optical projection system, in which ultraviolet light from a mercury-vapor lamp is projected through a first reticle and a focusing lens to obtain a first image pattern. The resist 52 is then developed, and the irradiated portions of the resist 52 are removed to provide openings in the resist 52.

Figure 4C:
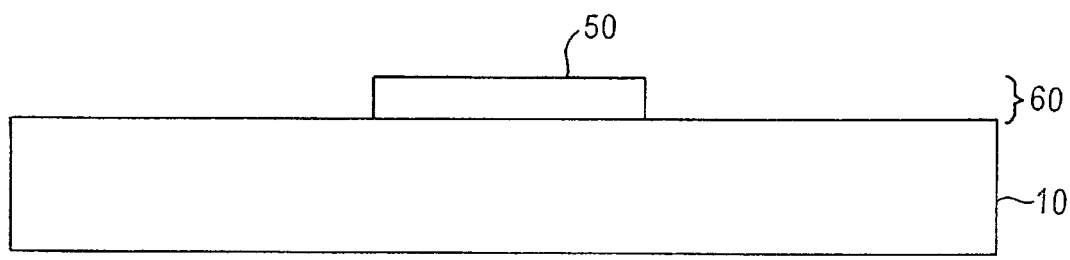

In FIG. 4C, an etch, typically anisotropic, is applied to remove the exposed portions of the first layer 50. After etching, the remaining portion of the first layer 50 provides a portion of the tuning layer 60. Once the etch has been completed and the tuning layer 60 formed, the laser thermal annealing process can be performed, as previously disclosed. For those areas over which there is no tuning layer 60, the amount of fluence received is unchanged. However, the amount of fluence received by those areas over which the tuning layer 60 is disposed is modified by the tuning layer 60, and this modification can either increase or decrease the amount of fluence absorbed by these particular layers.

Figure 4D:
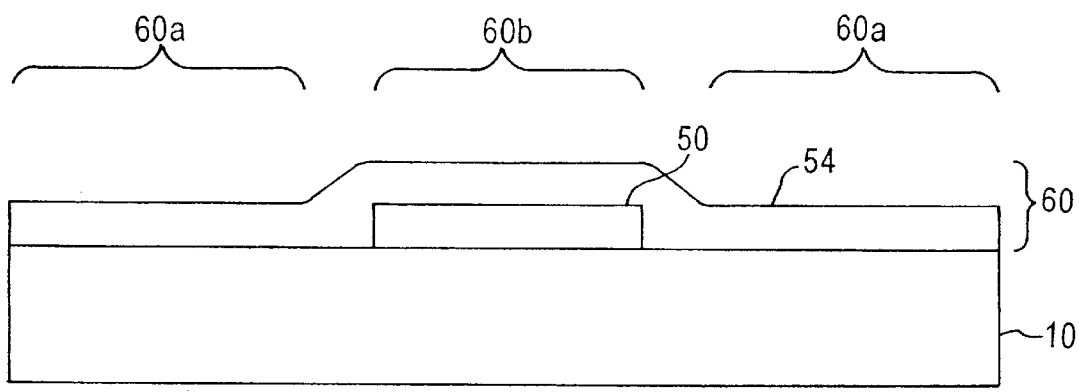

Alternatively, as illustrated in FIG. 4D, instead of laser thermal annealing after etching, a second layer 54 formed of the same tuning material as the first layer 50 can be blanket deposited over the substrate 10 and the first layer 50. The second layer 54 and the remaining portion of the first layer 50 thereby form a tuning layer 60 having two thicknesses. If the modification of the amount of fluence absorbed is dependent upon the thickness of the tuning layer 60, the amount of fluence received under the thinner portion 60a of the tuning layer 60 is different than the amount of fluence received under the thicker portion 60b of the tuning layer 60. In this manner, the tuning layer 60 modifies the amount of fluence absorbed by two amounts depending upon particular area over which the tuning layer 60 is disposed. Furthermore, the processes of etching and laser thermal annealing or etching, depositing another layer of tuning material and laser thermal annealing can be repeated to provide a tuning layer 60 that modifies the amount of fluence absorbed by two or more amounts depending upon the particular area over which the tuning layer 60 is disposed.

One method of determining an optimal thickness of the tuning layer 60 involves determining the wavelength ($\lambda$) of the laser being used and the index of refraction of the material of the tuning layer 60. The equation of $(\lambda)/(2*\text{index of refraction})$ provides the approximate desired thickness of the tuning layer 60. As can be determined from this equation, when a laser having a smaller wavelength is used, the thickness of the tuning layer 60 can be reduced. Also, the reflectivity of materials can vary depending upon the wavelength of the laser being used. For example, the reflectivity of silicon changes from about 35% to about 50% as the wavelength of the laser varies from infrared to ultraviolet.

Figure 5A:
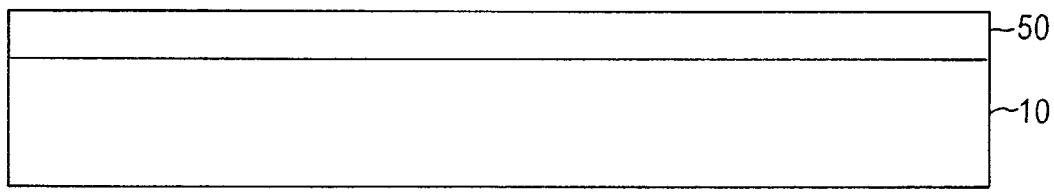
FIGS. 5A–5E schematically illustrate sequential phases of forming a tuning layer according to another aspect of the present invention.

Another method of providing a tuning layer is illustrated in FIGS. 5A–5E. As shown in FIG. 5A, after formation of source/drain regions in the substrate 10, a first layer 50 of tuning material is blanket deposited over the substrate 10. The invention is not limited as to a particular type of tuning material that is used for the first layer 50, so long as the tuning material either increases or decreases the amount of fluence being absorbed.

Figure 5B:
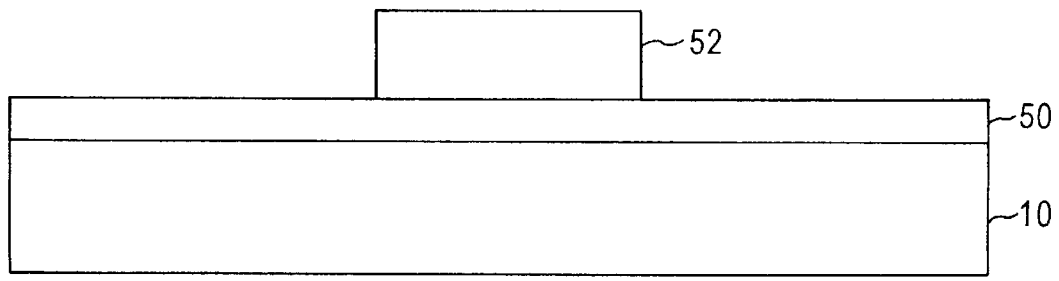

In FIG. 5B, the first layer 50 is etched to form a portion of the tuning layer. The etching of the first layer 50 typically involves forming a resist 52 on the first layer 50, and the resist 52 is selectively irradiated using a lithographic system. The resist 52 is then developed, and the irradiated portions of the resist 52 are removed to provide openings in the resist 52.

Figure 5C:
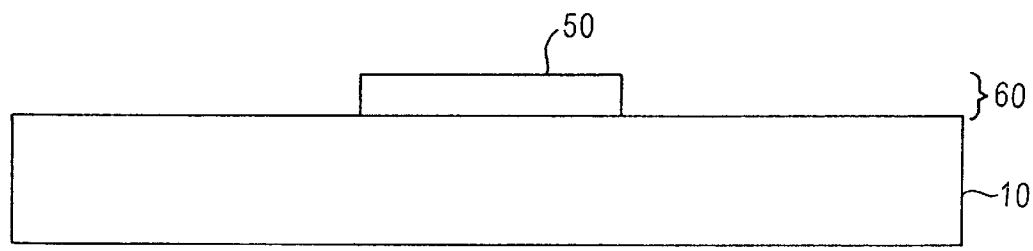

In FIG. 5C, an etch, typically anisotropic, is applied to remove the exposed portions of the first layer 50. After etching, the remaining portion of the first layer 50 provides a portion of the tuning layer 60.

Figure 5D:
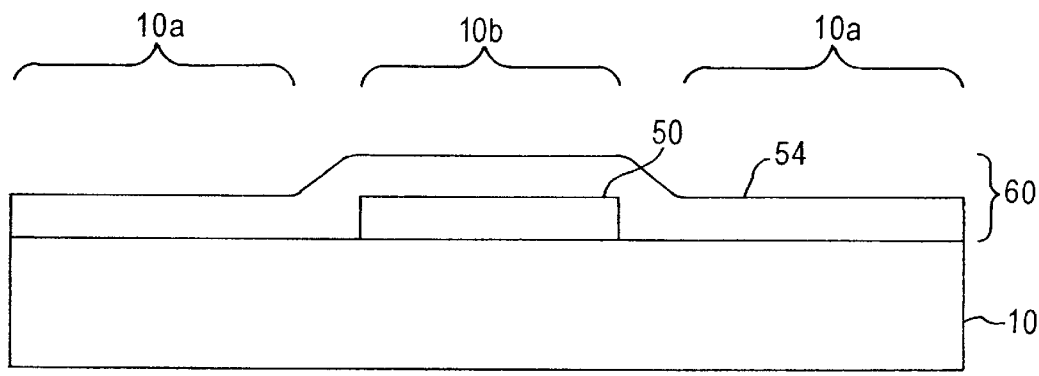

In FIG. 5D, after etching, a second layer 54, having a tuning material different than the tuning material of the first layer 50, is blanket deposited over the substrate 10 and the first layer 50 to form a tuning layer 60. Once the tuning layer 60 is formed, the laser thermal annealing process can be performed, as previously disclosed. The amount of fluence received by those areas 10a over which the just second layer 54 is disposed is modified only by the second layer 54, and the amount of fluence received by those areas 10b over which both the first and second layers 50, 54 are modified by both the first and second layers 50, 54. In this manner, the tuning layer 60 modifies the amount of fluence absorbed by two amounts depending upon the particular area over which the tuning layer 60 is disposed.

Figure 5E:
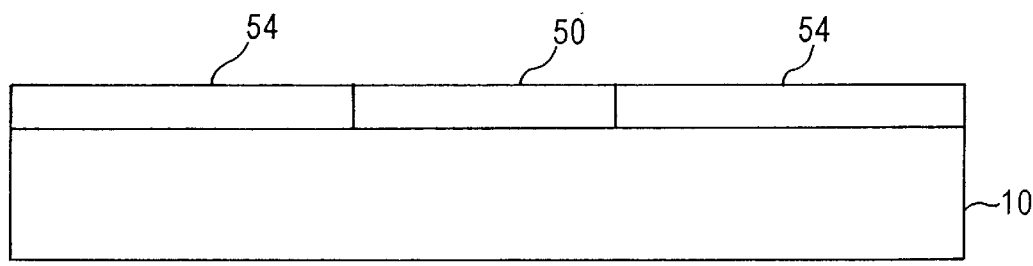

Alternatively, as illustrated in FIG. 5E, instead of laser thermal annealing after forming the second layer 54, a portion of the first and second layer 50, 54 can be removed using a CMP process. Although not necessary, the CMP process can be performed so that the thickness of the first and second layers 50, 54 are the same. Also, as a result, either the first layer 50 or the second layer 54, but not both, is disposed over a particular area. Thus, the amount of fluence absorbed by that particular area is modified only by one material, which is either the material of the first layer 50 or the material of the second layer 54. As such, by matching the relative effects to fluence absorption by the first layer 50 versus the second layer 54 with the relative reflectivity of one area versus another area, the fluence absorbed by different areas can be tuned to a desired amount or amounts.

Still further, additional materials for the tuning layer 60 can be added by repeating the steps of etching and depositing. In so doing, the tuning layer 60 can modify the amount of fluence absorbed by two or more amounts depending upon the particular area over which the tuning layer 60 is disposed.

Figure 6A:
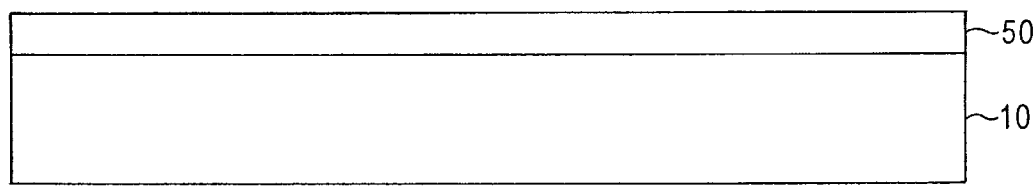
FIGS. 6A–6B schematically illustrate sequential phases of forming a tuning layer according to still another aspect of the present invention.
Figure 6B:
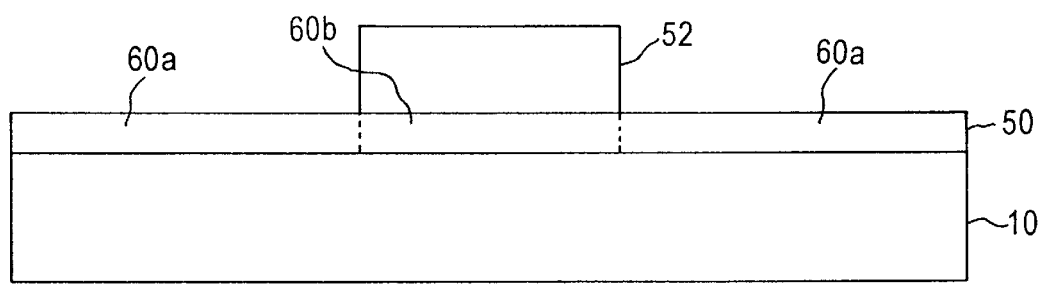

Still another method of providing a tuning layer is illustrated in FIGS. 6A–6B. As shown in FIG. 6A, after formation of source/drain regions in the substrate 10, a first layer 50 of tuning material is blanket deposited over the substrate 10, and the first layer 50 is formed from a material having adjustable tuning properties. For example, the tuning properties of an organic material, such as an resist, can depend upon whether or not the organic material has been irradiated or irradiated and developed, such that the portion of the organic material that was not irradiated has a tuning property different than the portion of the organic material that was not irradiated. The different tuning property can be a result of the irradiated portion of the resist, for example, shrinking as compared to the portion of the resist that was not irradiated As another example, a dielectric material can have different tuning properties depending upon whether or not the dielectric material is doped versus undoped or doped with a first dopant versus doped with a second dopant.

If the adjustable tuning material of the first layer 50 is adjustable by light exposure, the first layer 50 can be selectively irradiated using a lithographic system. Depending upon the type of material, the first layer 50 can also be developed. The image pattern projected onto the first layer 50 determines which the tuning properties of the exposed portions of the first layer 50 versus the unexposed portions of the first layer 50.

If, for example, the adjustable tuning material of the first layer 50 can be modified by selective doping, as shown in FIG. 6B, a resist 52 can be formed on the first layer 50, and the resist 52 is then selectively irradiated using a lithographic system. The resist 52 is then developed, and the irradiated portions of the resist 52 are removed to provide openings in the resist 52. Through these openings within the resist, the first layer 50 can be selectively doped to change the tuning properties of the first layer 50 not covered by the resist 52. This provides a tuning layer 60 having portions 60a with changed tuning properties and portions 60b with unchanged tuning properties.

It should be noted that the invention is not limited to the methods listed above, and any method capable of producing a tuning layer is acceptable for use with the invention. Furthermore, the methods listed above can be modified and/or combined to develop new or hybrid methods of forming a tuning layer capable of modifying the amount of fluence absorbed by two or more amounts depending upon the particular area over which the tuning layer is disposed.

Although the above-described methods for forming the tuning layer describe forming the tuning layer after the source/drain regions have been formed, the invention is not limited in this manner. For example, the source/drain regions can be doped through the materials used to form the tuning layer. Also, this doping can occur after an intermediary stage during the formation of the tuning layer or after the complete formation of the tuning layer.

The use of one or more tuning layers allows for controlled adjustment of the fluence received in particular areas on a wafer during laser thermal annealing. Thus, in situations in which an area receives too much or too little fluence, the fluence received by that particular area can be adjusted to a more optimal amount. Furthermore, if the wafer includes portions which require differing amounts of fluence absorption, the tuning layer can be used to modify the fluence absorption of these portions without also modifying the fluence provided by the laser.

The present invention can be practiced by employing conventional materials, methodology and equipment. Accordingly, the details of such materials, equipment and methodology are not set forth herein in detail. In the previous descriptions, numerous specific details are set forth, such as specific materials, structures, chemicals, processes, etc., in order to provide a thorough understanding of the present invention. However, it should be recognized that the present invention can be practiced without resorting to the details specifically set forth. In other instances, well-known processing structures have not been described in detail, in order not to unnecessarily obscure the present invention.

Only the preferred embodiment of the present invention and but a few examples of its versatility are shown and described in the present disclosure. It is to be understood that the present invention is capable of use in various other combinations and environments and is capable of changes or modifications within the scope of the inventive concepts as expressed herein.

What is claimed is:

1. A method of manufacturing a semiconductor device, comprising the steps of:
   forming semiconductor features over a substrate, the substrate having a first region and a second region, each of the first region and the second region including a plurality of the semiconductor features;
   introducing ions into the substrate to form active regions in the substrate;
   forming a tuning layer over at least a portion of the substrate; and
   activating the active regions by laser thermal annealing using a laser, wherein a transmissivity of fluence by the tuning layer differs between the first region and the second region.

2. The method according to claim 1, wherein the tuning layer increases an amount of fluence absorbed by the portion of the substrate below the tuning layer in comparison to an amount of fluence absorbed by a portion of the substrate not covered by the tuning layer.

3. The method according to claim 1, wherein the tuning layer decreases an amount of fluence absorbed by the portion of the substrate below the tuning layer in comparison to an amount of fluence absorbed by a portion of the substrate not covered by the tuning layer.

4. The method according to claim 1, further comprising the step of forming an additional tuning layer over the substrate.

5. The method according to claim 1, wherein the difference in the transmissivity of fluence between the first portion and the second portion results from the tuning later being formed on the first portion and not on the second portion.

6. The method according to claim 1, wherein the difference in the transmissivity of fluence between the first portion and the second portion results from the tuning layer in the first portion having different tuning properties than the tuning layer in the second portion.

7. The method according to claim 1, wherein the tuning layer is formed from a resist.

8. The method according to claim 1, wherein the tuning layer is formed from an organic anti-reflective material.

9. The method according to claim 1, wherein the tuning layer is formed from a dielectric.

10. A method of manufacturing a semiconductor device, comprising the steps of:
    forming a gate electrode over a substrate;
    introducing ions into the substrate to form source/drain regions in the substrate proximate to the gate electrode;
    forming a tuning layer over at least a portion of the substrate; and
    activating the source/drain regions by laser thermal annealing using a laser, wherein forming the tuning layers includes
    forming a first layer of tuning material over the substrate, and
    removing portions of the first layer to form the tuning layer.

11. The method according to claim 10, further comprising the step of forming a second layer of the tuning material over the substrate and the first layer to form the tuning layer.

12. The method according to claim 10, wherein the step of forming the tuning layer includes the steps of:
    removing portions of the first layer, and
    forming a second layer of a second tuning material over the first layer and the substrate to form the tuning layer, wherein the tuning material of the first layer is a first tuning material.

13. The method according to claim 12, further comprising the step of planarizing the first and second layers, wherein the first and second layers have approximately equal depths.

14. A method of manufacturing a semiconductor device, comprising the steps of:
    forming a gate electrode over a substrate;
    introducing ions into the substrate to form source/drain regions in the substrate proximate to the gate electrode;
    forming a tuning layer over at least a portion of the substrate, the tuning layer is formed from a material having adjustable tuning properties;
    adjusting the tuning properties of the tuning layer after formation of the tuning layer; and
    activating the source/drain regions by laser thermal annealing using a laser after the tuning properties of the tuning layer have been adjusted.

15. The method according to claim 14, wherein the step of adjusting the tuning layer includes selectively irradiating portions of the tuning layer.

16. The method according to claim 14, wherein the step of adjusting the tuning layer includes selectively doping portions of the tuning layer.

17. A method of manufacturing a semiconductor device, comprising the steps of:

forming semiconductor features over a substrate, the substrate having a first region and a second region with a fluence absorption characteristic in the first region different than a fluence absorption characteristic in the second region;

forming a tuning layer over at least a portion of the substrate; and laser thermal annealing using a laser, wherein the tuning layer adjusts the amount of fluence absorbed during the step of laser thermal annealing, wherein the first region absorbs an equal amount of fluence during the laser thermal annealing as absorbed by the second region.

18. The method according to claim 17, wherein the tuning layer increases an amount of fluence absorbed by the portion of the substrate below the tuning layer in comparison to an amount of fluence absorbed by a portion of the substrate not covered by the tuning layer.

19. The method according to claim 17, wherein the tuning layer decreases an amount of fluence absorbed by the portion of the substrate below the tuning layer in comparison to an amount of fluence absorbed by a portion of the substrate not covered by the tuning layer.

20. The method according to claim 14, wherein certain portions of the tuning layer are adjusted and other portions of the tuning layer are not adjusted.

* * * * *